US012089466B2

(12) United States Patent
Wang et al.

(10) Patent No.: US 12,089,466 B2
(45) Date of Patent: Sep. 10, 2024

(54) DISPLAY PANEL HAVING FIVE FIRST, FOUR SECOND AND FOUR THIRD SUB-PIXELS ARRANGED IN A VIRTUAL RECTANGLE WITH FIVE FIRST SUB-PIXELS HAVING DIFFERENT AREAS FROM EACH OTHER AND FOUR THIRD SUB-PIXELS HAVING DIFFERENT AREAS FROM EACH OTHER

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yangpeng Wang, Beijing (CN); Benlian Wang, Beijing (CN); Yang Wang, Beijing (CN); Haijun Yin, Beijing (CN); Haijun Qiu, Beijing (CN); Yao Hu, Beijing (CN); Weinan Dai, Beijing (CN)

(73) Assignees: CHENGDU BOE OPTOELECTRONICS TECHNOLOGY CO., LTD. (CN); BOE TECHNOLOGY GROUP CO., LTD. (CN)

( * ) Notice: Subject to any disclaimer, the term of this patent is extended or adjusted under 35 U.S.C. 154(b) by 0 days.

(21) Appl. No.: 17/859,591

(22) Filed: Jul. 7, 2022

(65) Prior Publication Data
US 2022/0336546 A1    Oct. 20, 2022

Related U.S. Application Data

(63) Continuation of application No. 16/345,979, filed as application No. PCT/CN2018/122021 on Dec. 19, 2018, now abandoned.

(30) Foreign Application Priority Data

Jan. 2, 2018    (CN) .......................... 201810002739.4

(51) Int. Cl.
H10K 59/35      (2023.01)
H10K 71/00      (2023.01)

(52) U.S. Cl.
CPC ......... *H10K 59/353* (2023.02); *H10K 59/352* (2023.02); *H10K 71/00* (2023.02)

(58) Field of Classification Search
CPC .......................... H10K 59/352; H10K 59/353
See application file for complete search history.

(56) References Cited

U.S. PATENT DOCUMENTS 8,354,789 B2    1/2013  Kim et al.
10,680,041 B2*  6/2020  Li ........................ H10K 59/353
(Continued)

FOREIGN PATENT DOCUMENTS

CN    103311266 A    9/2013
CN    103366683 A    10/2013
(Continued)

OTHER PUBLICATIONS

Final Office Action, U.S. Appl. No. 16/345,979, Apr. 8, 2022, 17 pp.
(Continued)

*Primary Examiner* — Anh D Mai
(74) *Attorney, Agent, or Firm* — Myers Bigel, P.A.

(57) ABSTRACT

The present disclosure provides a pixel arrangement including five first sub-pixels located respectively at a central position and four vertex positions of a first virtual rectangle, four second sub-pixels located at respective central positions of four sides of the first virtual rectangle, and four third sub-pixels located in respective four second virtual rectangles, each of the second virtual rectangles being defined by a corresponding one of the four vertex positions of the
(Continued)

first virtual rectangle, respective center positions of two adjacent sides of the four sides of the first virtual rectangle that contain the corresponding vertex position, and the center position of the first virtual rectangle, the four second virtual rectangles forming the first virtual rectangle, and wherein, among the four third sub-pixels, an area of at least one third sub-pixel is different from that of other third sub-pixel. A display panel including the pixel arrangement is also provided.

11 Claims, 12 Drawing Sheets

(56) References Cited

U.S. PATENT DOCUMENTS

| | | | |
|---|---|---|---|
| 10,832,616 | B2 | 11/2020 | Lee |
| 10,991,768 | B2 | 4/2021 | Li et al. |
| 11,271,048 | B2 * | 3/2022 | Qiu ............... H10K 59/352 |
| 2013/0234917 | A1 | 9/2013 | Lee |
| 2014/0022290 | A1 | 1/2014 | Saigo |
| 2014/0071030 | A1 | 3/2014 | Lee |
| 2015/0015466 | A1 | 1/2015 | Feng |
| 2015/0091785 | A1 | 4/2015 | Lee |
| 2015/0109268 | A1 | 4/2015 | Huang et al. |
| 2015/0162391 | A1 | 6/2015 | Kim |
| 2015/0364075 | A1 | 12/2015 | Sato et al. |
| 2016/0240592 | A1 | 8/2016 | Li et al. |
| 2016/0253943 | A1 | 9/2016 | Wang |
| 2016/0343284 | A1 | 11/2016 | Sun |
| 2017/0287988 | A1 | 10/2017 | Lee et al. |
| 2017/0294491 | A1 | 10/2017 | Jo et al. |
| 2017/0309688 | A1 | 10/2017 | Lee et al. |
| 2018/0247984 | A1 | 8/2018 | Wang et al. |
| 2018/0357953 | A1 | 12/2018 | Hu |
| 2018/0366052 | A1 | 12/2018 | Shi |
| 2019/0035861 | A1 | 1/2019 | Wang et al. |
| 2019/0252469 | A1 | 8/2019 | Xiao et al. |
| 2020/0357322 | A1 | 11/2020 | Wu et al. |
| 2020/0357861 | A1 * | 11/2020 | Wang ............... C23C 14/12 |
| 2020/0357862 | A1 | 11/2020 | Wang et al. |
| 2021/0027691 | A1 | 1/2021 | Hu et al. |

FOREIGN PATENT DOCUMENTS

| | | | |
|---|---|---|---|
| CN | 103941490 A | 7/2014 | |
| CN | 104282727 A | 1/2015 | |
| CN | 104701341 A | 6/2015 | |
| CN | 105826349 A | 8/2016 | |
| CN | 106298851 A | 1/2017 | |
| CN | 106486513 A | 3/2017 | |
| CN | 106920832 A | 7/2017 | |
| CN | 107248378 A | 10/2017 | |
| CN | 107275359 A | 10/2017 | |
| CN | 107275360 A | 10/2017 | |
| CN | 107305905 A | 10/2017 | |
| CN | 207966982 U * | 10/2018 | ......... H01L 27/3216 |
| CN | 207966983 U | 10/2018 | |
| CN | 207966985 U | 10/2018 | |
| CN | 207966994 U | 10/2018 | |
| CN | 207966995 U | 10/2018 | |
| CN | 109994505 A | 7/2019 | |
| JP | 2005352140 A * | 12/2005 | ........... H10K 59/353 |
| KR | 20170116598 A | 10/2017 | |

OTHER PUBLICATIONS

First Office Action and English language translation, CN Patent Application No. 201820003576.7, Jun. 19, 2018, 4 pp.
First Office Action and English language translation, CN Patent Application No. 201820003815.9, Jun. 19, 2018, 4 pp.
First Office Action and English language translation, CN Patent Application No. 201820003548.5, Jun. 19, 2018, 5 pp.
First Office Action and English language translation, CN Patent Application No. 201820235510.0, Jul. 20, 2018, 4 pp.
First Office Action and English language translation, CN Patent Application No. 201820241941.8, Jul. 23, 2018, 5 pp.
International Search Report and Written Opinion of the International Searching Authority (with English language translation), International Application No. PCT/CN2018/122021, Feb. 27, 2019, 11 pp.
International Search Report and Written Opinion of the International Searching Authority (with English language translation), International Application No. PCT/CN2018/122022, Mar. 26, 2019, 11 pp.
International Search Report and Written Opinion of the International Searching Authority (with English language translation), International Application No. PCT/CN2018/122063, Mar. 18, 2019, 13 pp.
International Search Report and Written Opinion of the International Searching Authority (with English language translation), International Application No. PCT/CN2018/122205, Feb. 27, 2019, 14 pp.
International Search Report and Written Opinion of the International Searching Authority (with English language translation), International Application No. PCT/CN2018/122206, Mar. 25, 2019, 11 pp.
Non-Final Office Action, U.S. Appl. No. 16/345,979, Dec. 30, 2021, 19 pp.
Notice of Allowance and Fee(s) Due, U.S. Appl. No. 16/468,611, Jan. 15, 2021, 17 pp.
Notice of Allowance and Fee(s) Due, U.S. Appl. No. 16/462,776, Oct. 1, 2020, 15 pp.
Notice to the Applicant Regarding a Non-Compliant or Non-Responsive Amendment, U.S. Appl. No. 16/345,979, Jul. 30, 2021, 4 pp.
Requirement for Restriction/Election, U.S. Appl. No. 16/345,979, Mar. 2, 2021, 6 pp.
First Office Action of Chinese patent application 201810002739.4; issued Mar. 20, 2024 (12 pages, including English translation).
First Office Action of Chinese patent application 201810134096.9; issued Mar. 13, 2024 (12 pages, including English translation).
First Office Action of Chinese patent application 201810135146.5; issued Mar. 12, 2024 (11 pages, including English translation).

* cited by examiner

DISPLAY PANEL HAVING FIVE FIRST, FOUR SECOND AND FOUR THIRD SUB-PIXELS ARRANGED IN A VIRTUAL RECTANGLE WITH FIVE FIRST SUB-PIXELS HAVING DIFFERENT AREAS FROM EACH OTHER AND FOUR THIRD SUB-PIXELS HAVING DIFFERENT AREAS FROM EACH OTHER

CROSS-REFERENCE TO RELATED APPLICATIONS

The present application is a continuation of U.S. patent application Ser. No. 16/345,979, filed on Apr. 29, 2019, which itself is a 35 U.S.C. 371 national stage application of PCT International Application No. PCT/CN2018/122021, filed on Dec. 19, 2018, which claims the benefit of Chinese Patent Application No. 201810002739.4, filed on Jan. 2, 2018, the contents of which are incorporated herein by reference in their entireties.

TECHNICAL FIELD

The present disclosure relates to the field of display, and in particular, to a pixel arrangement, a method of manufacturing the pixel arrangement, a display panel, a display device, and a mask.

BACKGROUND

Compared with liquid crystal displays (LCDs), organic electroluminescent (OLED) displays have advantages such as low energy consumption, low production cost, self-illumination, wide viewing angle and fast responsiveness. Currently, in the field of flat panel displays such as mobile phones, PDAs, and digital cameras, OLED display devices have begun to replace traditional liquid crystal displays.

An OLED display typically includes a base substrate and sub-pixels arranged in a matrix on the base substrate. The sub-pixels are generally formed by evaporating an organic light-emitting material onto an array substrate using a fine metal mask (FMM).

SUMMARY

According to the first aspect of the present disclosure, a pixel arrangement is provided, including: five first sub-pixels located respectively at a central position and four vertex positions of a first virtual rectangle; four second sub-pixels located at respective central positions of four sides of the first virtual rectangle; and four third sub-pixels located in respective four second virtual rectangles, each of the second virtual rectangles being defined by a corresponding vertex position of the four vertex positions of the first virtual rectangle, respective center positions of two adjacent sides of the four sides of the first virtual rectangle that contain the corresponding vertex position, and the center position of the first virtual rectangle, the four second virtual rectangles forming the first virtual rectangle, and wherein, among the four third sub-pixels, an area of at least one third sub-pixel is different from that of other third sub-pixel.

In some embodiments, among the five first sub-pixels, an area of at least one first sub-pixel is different from that of other first sub-pixel.

In some embodiments, among the four second sub-pixels, an area of at least one second sub-pixel is different from that of other second sub-pixel.

In some embodiments, the five first sub-pixels each have a same area, and the four second sub-pixels each have a same area.

In some embodiments, the four third sub-pixels have a same type of shape.

In some embodiments, the four third sub-pixels have a shape different from that of the five first sub-pixels and different from that of the four second sub-pixels.

In some embodiments, among the four second sub-pixels, a shape of at least one second sub-pixel is different from that of other second sub-pixel.

In some embodiments, among the five first sub-pixels, a shape of at least one first sub-pixel is different from that of other first sub-pixel.

In some embodiments, the five first sub-pixels are arranged substantially equidistantly with respect to each other, the four second sub-pixels are arranged substantially equidistantly with respect to each other, and among the four third sub-pixels, a distance between at least one third sub-pixel and a directly adjacent first sub-pixel or second sub-pixel is different from a distance between each of other third sub-pixels and a directly adjacent first sub-pixel or second sub-pixel.

In some embodiments, the first sub-pixel located at the center position of the first virtual rectangle has a first distance in a first direction along a diagonal line of the first virtual rectangle from a directly adjacent third sub-pixel among the four third sub-pixels, and the first sub-pixel located at the center position has a second distance in a second direction along the other diagonal line of the first virtual rectangle from a directly adjacent third sub-pixel among the four third sub-pixels, a ratio of the first distance to the second distance is in a range of 1 to 1.5, and each of the four second sub-pixels has a third distance in the first direction from a directly adjacent third sub-pixel among the four third sub-pixels, each of the four second sub-pixels has a fourth distance in the second direction from a directly adjacent third sub-pixel among the four third sub-pixels, a ratio of the third distance to the fourth distance is in a range of 1 to 1.5.

In some embodiments, the first sub-pixels are red sub-pixels, the second sub-pixels are blue sub-pixels, and the third sub-pixels are green sub-pixels.

In some embodiments, the first sub-pixels are blue sub-pixels, the second sub-pixels are red sub-pixels, and the third sub-pixels are green sub-pixels.

In some embodiments, two diagonal lines of the first virtual rectangle are perpendicular to each other.

According to the second aspect of the present disclosure, a display panel is provided, including: a display substrate; and a plurality of adjoining pixel arrangements according the first aspect of the present disclosure, the pixel arrangements being formed on the display substrate, wherein in a row direction every two directly adjacent ones of first virtual rectangles have a common side such that sub-pixels on the common side are shared by two directly adjacent first virtual rectangles, and wherein in a column direction every two directly adjacent ones of the first virtual rectangles has a common side such that sub-pixels on the common side are shared by two directly adjacent first virtual rectangles.

In some embodiments, the first sub-pixels are red sub-pixels, the second sub-pixels are blue sub-pixels, and the third sub-pixels are green sub-pixels.

In some embodiments, the red sub-pixels have a first total area, the green sub-pixels have a second total area, and the blue sub-pixels have a third total area, and wherein the first total area, the second total area, and the third total area have a ratio of 1:(1.1 to 1.5):(1.2 to 1.7), further 1:(1.2 to 1.35):(1.4 to 1.55), or further 1:1.27:1.46.

In some embodiments, the red sub-pixels, the green sub-pixels, and the blue sub-pixels have a ratio of approximately 1:2:1 in quantity.

These and other aspects of the present disclosure will be apparent from and elucidated with reference to the embodiment(s) described hereinafter.

BRIEF DESCRIPTION OF THE DRAWINGS

Further details, features and advantages of the present disclosure are disclosed in the following description of exemplary embodiments in conjunction with the accompanying drawings in which.

In the figures, different reference numerals, which are a combination of the same number and different letter suffixes, can be collectively referenced by the number.

DETAILED DESCRIPTION

Figure 1:
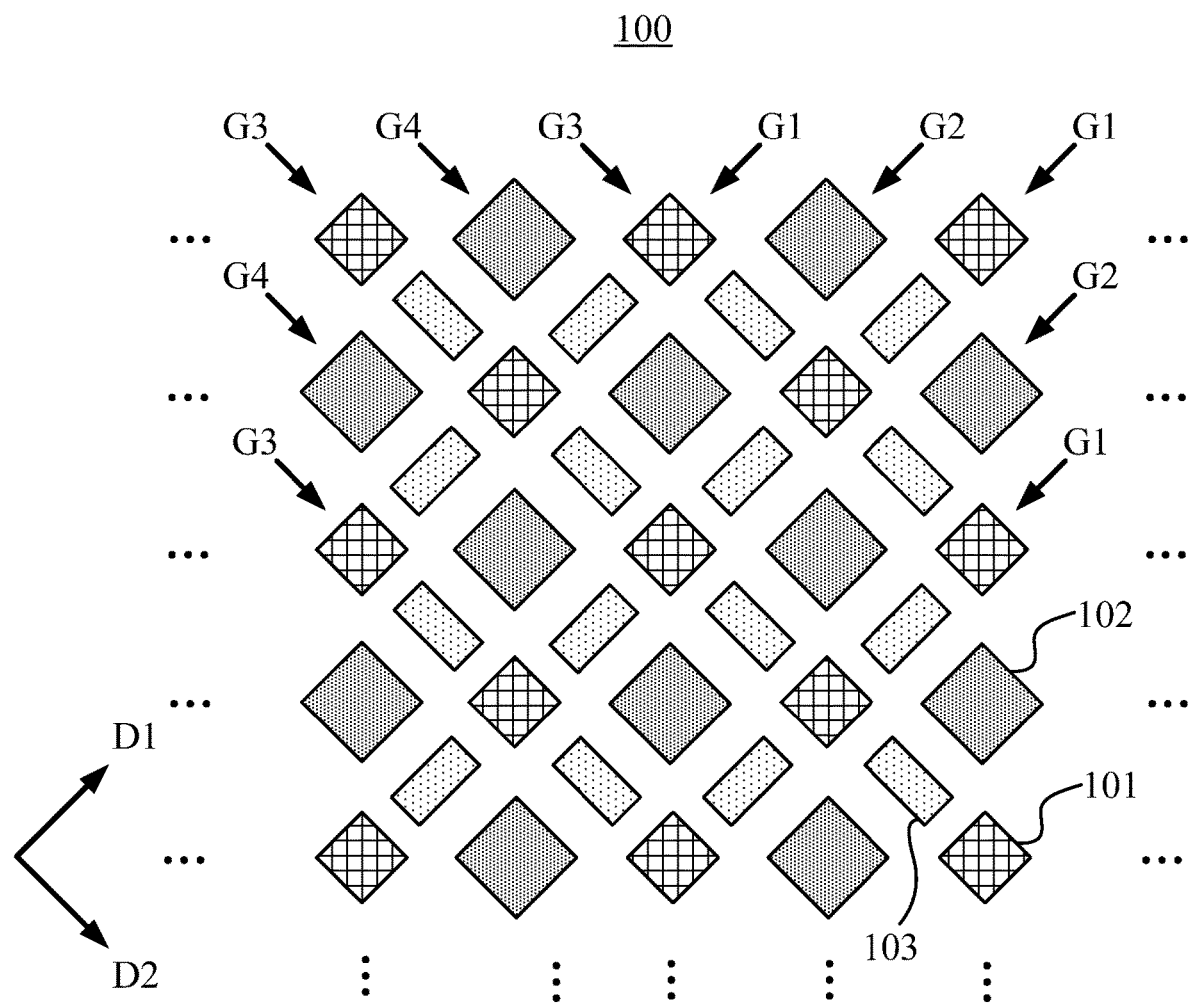
FIG. 1 is a schematic plan view of a pixel arrangement in accordance with an embodiment of the present disclosure.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. Terms such as "before" or "preceding" and "after" or "followed by" may be similarly used, for example, to indicate an order in which light passes through the elements. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "directly adjacent to" another element or layer, there are no intervening elements or layers present. In no event, however, should "on" or "directly on" be construed as requiring a layer to completely cover an underlying layer.

Embodiments of the disclosure are described herein with reference to schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments of the present disclosure will be described in detail below with reference to the accompanying drawings.

FIG. 1 is a schematic plan view of a pixel arrangement 100 in accordance with an embodiment of the present disclosure.

As shown in FIG. 1, the pixel arrangement 100 includes a plurality of first groups of sub-pixels (also referred to as "first repeating units") G1 arranged in a first direction D1 and a plurality of second groups of sub-pixels (also referred to as "second repeating units") G2 arranged in the first direction D1. The plurality of first groups G1 and the plurality of second groups G2 are alternately arranged in a second direction D2 perpendicular to the first direction D1.

Each of the plurality of first groups G1 includes a plurality of first sub-pixels 101 and a plurality of third sub-pixels 103 that are alternately arranged. Each of the plurality of second groups G2 includes a plurality of third sub-pixels 103 and a plurality of second sub-pixels 102 that are alternately arranged. The plurality of first groups G1 and the plurality of second groups G2 are further arranged to form a plurality of third groups of sub-pixels G3 arranged in the second direction D2 and a plurality of fourth groups of sub-pixels G4 arranged in the second direction D2. The plurality of third groups of sub-pixels G3 and the plurality of fourth groups of sub-pixels G4 are alternately arranged in the first direction D1. Each of the plurality of third groups G3 includes a plurality of first sub-pixels 101 and a plurality of third sub-pixels 103 alternately arranged, and each of the plurality of fourth groups G4 includes a plurality of third sub-pixels 103 and a plurality of second sub-pixels 102 arranged alternately. As shown in FIG. 1, each of the first sub-pixels 101 is directly adjacent to four third sub-pixels 103, and each of the second sub-pixels 102 is also directly adjacent to four third sub-pixels 103.

Compared with existing pixel arrangements, the pixel arrangement 100 may allow the first sub-pixels 101, the second sub-pixels 102, and the third sub-pixels 103 to be more closely arranged under the same process conditions, thereby increasing the area of individual sub-pixels as much as possible. This, in turn, facilitates a reduced drive current of the display element and hence an increased lifetime of the display element.

In this embodiment, the third group of sub-pixels G3 has the same pattern as the first group of sub-pixels G1, and the fourth group of sub-pixels G4 has the same pattern as the second group of sub-pixels G2. Specifically, as shown in FIG. 1, the third group of sub-pixels G3 will coincide with the first group of sub-pixels G1 if rotated (clockwise or counterclockwise) by 90 degrees, and the fourth group of sub-pixels G4 will coincide with the second group of sub-pixels G2 if rotated (clockwise or counterclockwise) by 90 degrees. This provides an even distribution of the sub-pixels, facilitating the improvement of the display effect.

In the example of FIG. 1, the first, second, and third sub-pixels 101, 102, and 103 are disposed substantially equidistantly with respect to each other. In some variations, the third sub-pixels 103 may be arranged differently. For example, the third sub-pixels 103 may be arranged substantially equidistantly with respect to each other, and the first sub-pixels 101 and the second sub-pixels 102 are arranged substantially equidistantly with respect to each other. It will be understood that in this document the term "substantially" used in connection with "equidistant", "parallel", "same", "equal to", etc., is intended to encompass deviations as a result of manufacturing processes.

Figure 2:
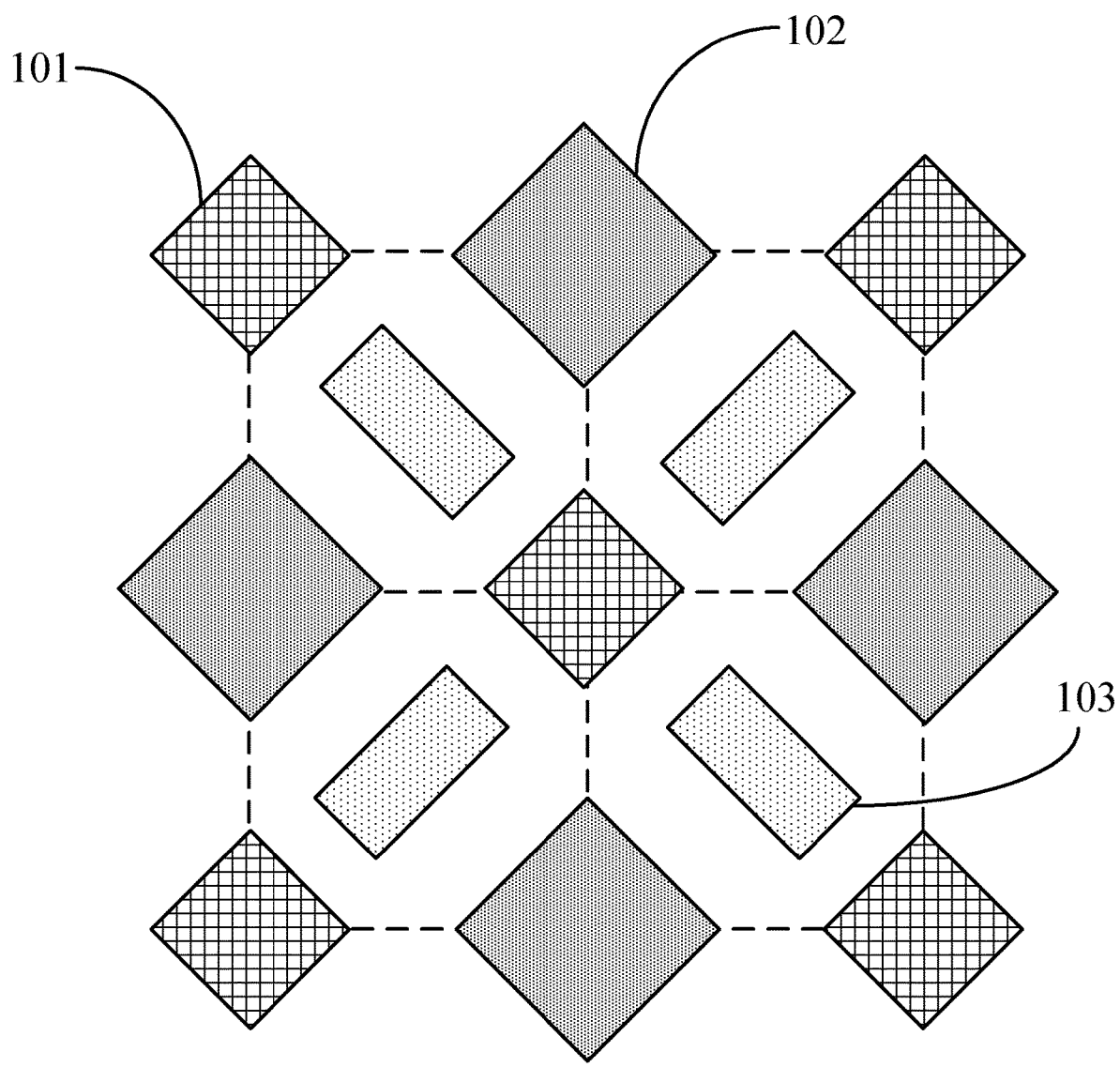
FIG. 2 is a schematic plan view of a partial area of the pixel arrangement of FIG. 1.

FIG. 2 is a schematic plan view of a partial area of the pixel arrangement 100 of FIG. 1.

As shown in FIG. 2, the plurality of first sub-pixels 101 have substantially the same shape and area, the plurality of second sub-pixels 102 have substantially the same shape and area, and the plurality of third sub-pixels 103 have substantially the same shape and area. In this example, the four third sub-pixels 103 as a whole are horizontally symmetrical and also vertically symmetrical. This provides uniform light emission.

In alternative embodiments, some of the third sub-pixels 103 may have a different shape and/or area than that of the rest of the third sub-pixels 103, as will be described later. Additionally, each of the third sub-pixels 103 may be oriented at an angle different from the angle shown.

It will be understood that the distance between each third sub-pixel 103 and the directly adjacent first sub-pixel 101 and the distance between the third sub-pixel 103 and the directly adjacent second sub-pixel 102 must be greater than or equal to the process limit distance to meet the process requirements. Here, the distance between two sub-pixels is defined as the shortest one of the distances between points of one of the two sub-pixels and points of the other of the two sub-pixels. The process limit distance depends on the manufacturing process used. In embodiments in which a fine metal mask (FMM) is used in connection with etching, the minimum spacing is about 16 μm. In embodiments in which laser or electroforming, etc., is employed, the minimum spacing could be even smaller.

FIG. 2 further shows a large rectangle (hereinafter referred to as "first virtual rectangle") defined by broken lines connecting the first sub-pixels 101 at four corners. The first virtual rectangle includes four small rectangles (hereinafter referred to as "second virtual rectangles"), each of which is defined by a corresponding one of the four vertex positions of the first virtual rectangle, respective center positions of two adjacent sides of the four sides of the first virtual rectangle that contain the corresponding vertex position, and a center position of the first virtual rectangle. The pixel arrangement of FIG. 2 is described below with reference to the first virtual rectangle and the second virtual rectangle.

The pixel arrangement includes five first sub-pixels 101 respectively located at the central position and the four vertex positions of the first virtual rectangle, four second sub-pixels 102 located at respective central positions of the four sides of the first virtual rectangle, and four third sub-pixels 103 located within the respective four second virtual rectangles. It will be understood that the phrase "a sub-pixel located at a position" means that the sub-pixel overlaps the position without necessarily requiring the center of the sub-pixel to overlap the position. The center of the sub-pixel may be the geometric center of the sub-pixel or the center of the light-emitting zone of the sub-pixel.

Figure 3:
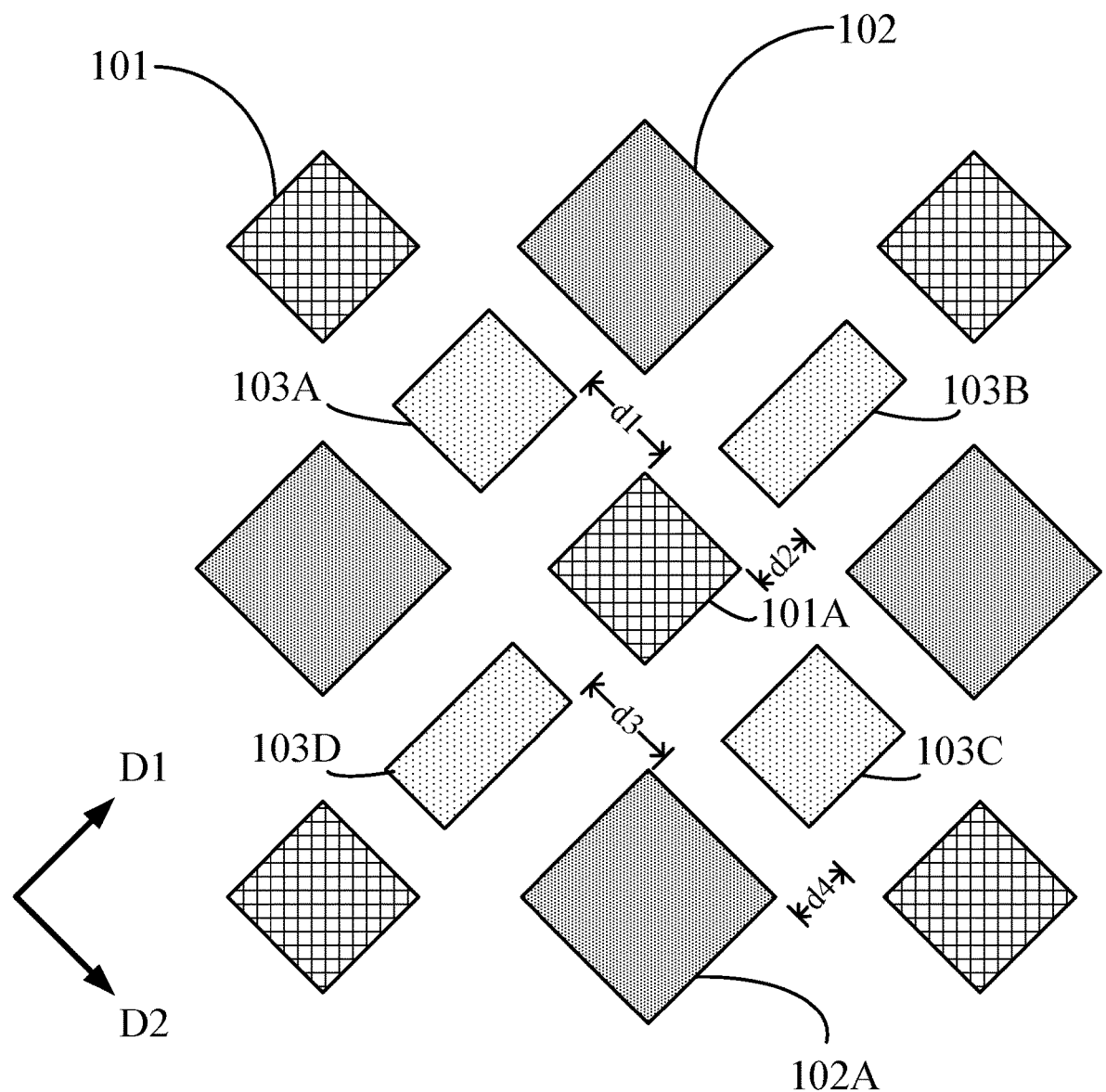
FIG. 3 is a schematic plan view of a partial area of a variation of the pixel arrangement of FIG. 1.

FIG. 3 illustrates a partial area of a variation of the pixel arrangement 100 of FIG. 1.

In this embodiment, first ones of the third sub-pixels 103 each have an area and second ones of the third sub-pixels 103 each have another area different than that area. As shown in FIG. 3, the third sub-pixels 103A and 103C each have an area different from that of the third sub-pixel 103B or 103D. In this example, the third sub-pixels 103A and 103C further have shapes different from the shapes of the third sub-pixels 103B and 103D. Specifically, the third sub-pixels 103A and 103C are squares, and the third sub-pixels 103B and 103D are non-square rectangles. This provides a flexible design of the pixel pattern. Herein, the third sub-pixels 103A, 103B, 103C, and 103D may also be referred to as having the same type of shape in that their shapes are all rectangular (although having different aspect ratios). In this sense, for example, acute triangles and obtuse triangles are considered to be the same type of shape because they are all triangles.

In this embodiment, the third sub-pixels 103 are arranged such that each of first ones of the third sub-pixels 103 has a first distance d1 from a directly adjacent one of the first sub-pixels 101 in one of the first direction D1 and the second direction D2, and each of second ones of the third sub-pixels 103 has a second distance d2 from a directly adjacent one of the first sub-pixels 101 in the other of the first direction D1 and the second direction D2. As shown in FIG. 3, the third sub-pixel 103A has the first distance d1 from the directly adjacent first sub-pixel 101A in the second direction D2, and the third sub-pixel 103B has the second distance d2 from the directly adjacent first sub-pixel 101A in the first direction D1. The ratio of the first distance d1 to the second distance d2 is in the range of 1 to 1.5, such as 1.1, 1.2, 1.3, 1.4, etc. Such a configuration takes into account both the area of the sub-pixels and the limit distance that the process can achieve, enabling a flexible design of the pixel pattern.

In this embodiment, the third sub-pixels 103 are arranged such that each of first ones of the third sub-pixels 103 has a third distance d3 from a directly adjacent one of the second sub-pixels 102 in one of the first direction D1 and the second direction D2, and each of second ones of the third sub-pixels 103 has a fourth distance d4 from a directly adjacent one of the second sub-pixels 102 in the other of the first direction D1 and the second direction D2. As shown in FIG. 3, the third sub-pixel 103D has the third distance d3 from the directly adjacent second sub-pixel 102A in the second direction D2, and the third sub-pixel 103C has the fourth distance d4 from the directly adjacent second sub-pixel 102A in first direction D1. The ratio of the third distance d3 to the fourth distance d4 is in the range of 1 to 1.5, such as 1.1, 1.2, 1.3, 1.4, etc. Such a configuration takes into account both the area of the sub-pixels and the limit distance that the process can achieve, enabling a flexible design of the pixel pattern.

In alternative embodiments, the third sub-pixels 103A, 103B, 103C, and 103D may also have substantially the same area (but different shapes). For example, the third sub-pixels 103A and 103C may have a different aspect ratio from, but still substantially the same area as the third sub-pixels 103B and 103D.

Figure 4:
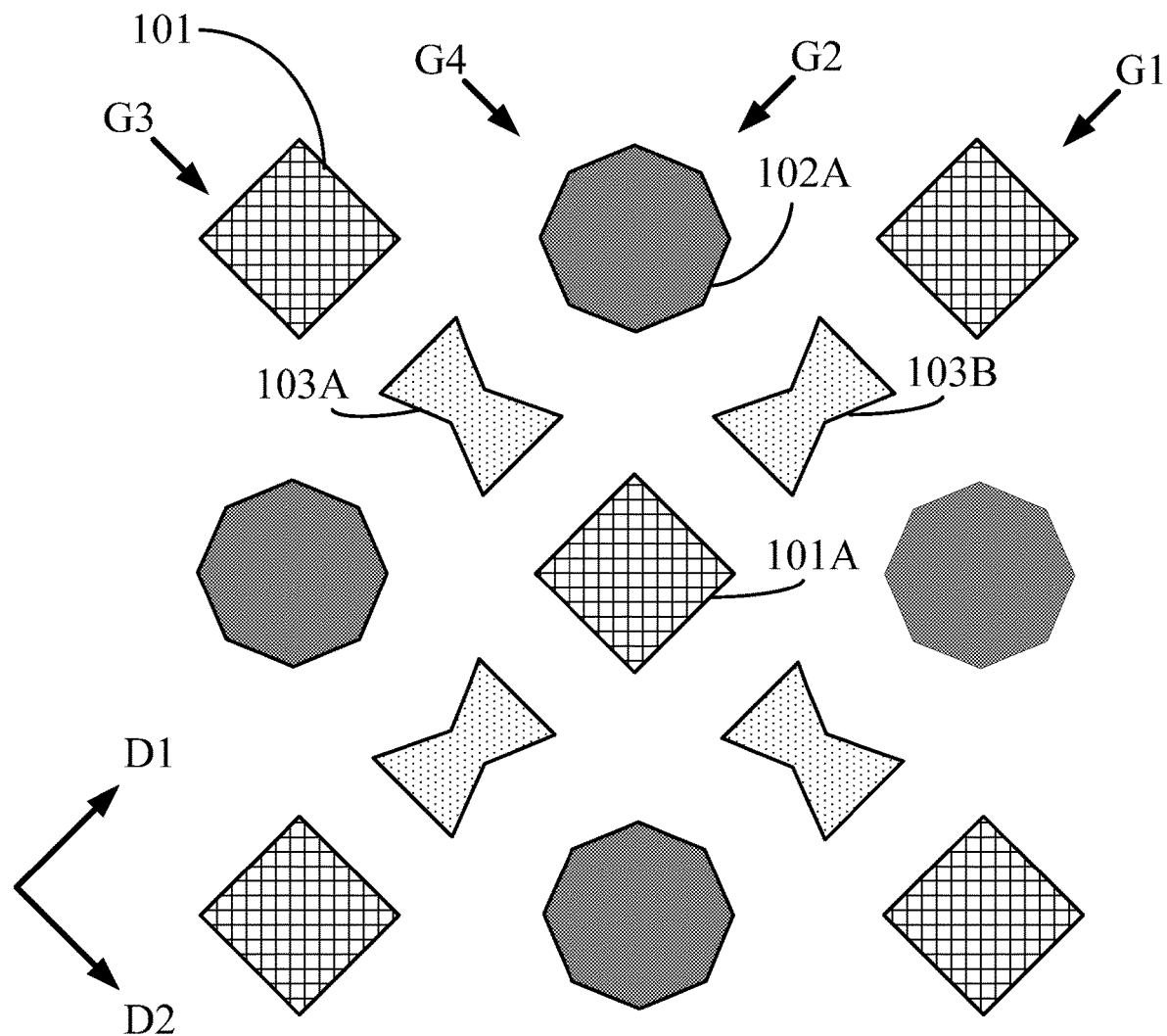
FIG. 4 is a schematic plan view of a partial area of another variation of the pixel arrangement of FIG. 1.

FIG. 4 is a schematic plan view of a partial area of another variation of the pixel arrangement 100 of FIG. 1.

An exemplary variation in the shape of the second sub-pixel 102 and the third sub-pixel 103 is shown in FIG. 4. In this example, the second sub-pixels 102 have substantially the same shape of a convex polygon, and the third sub-pixels 103 have substantially the same shape of a concave polygon.

In this embodiment, each of the third sub-pixels 103 in the plurality of first groups of sub-pixels G1 has a side substantially parallel and opposite to a side of a directly adjacent one of the first sub-pixels 101 in the first direction D1. As shown in FIG. 4, the third sub-pixel 103B has a side substantially parallel and opposite to a side of the directly adjacent first side pixel 101A in the first direction D1.

In this embodiment, each of the third sub-pixels 103 in the plurality of second groups of sub-pixels G2 has a side substantially parallel and opposite to a side of a directly adjacent one of the second sub-pixels 102 in the first direction D1. As shown in FIG. 4, the third sub-pixel 103A has a side substantially parallel and opposite to a side of the directly adjacent second sub-pixel 102A in the first direction D1.

In this embodiment, each of the third sub-pixels 103 in the plurality of third groups of sub-pixels G3 has a side substantially parallel and opposite to a side of a directly adjacent one of the first sub-pixels 101 in the second direction D2. As shown in FIG. 4, the third sub-pixel 103A has a side substantially parallel and opposite to a side of the directly adjacent first sub-pixel 101A in the second direction D2.

In this embodiment, each of the third sub-pixels 103 in the plurality of fourth groups of sub-pixels G4 has a side substantially parallel and opposite to a side of a directly adjacent one of the second sub-pixels 102 in the second direction D2. As shown in FIG. 4, the third sub-pixel 103A has a side substantially parallel and opposite to a side of the directly adjacent second sub-pixel 102A in the second direction D2.

Such a configuration provides a uniform width of a gap between a third sub-pixel 103 and a directly adjacent first sub-pixel 101 and a uniform width of a gap between the third sub-pixel 103 and a directly adjacent second sub-pixel 102, which is advantageous for providing a desired display effect. In some embodiments, a pitch between the third sub-pixel 103 and the directly adjacent first sub-pixel 101 is substantially equal to a pitch between the third sub-pixel 103 and the directly adjacent second sub-pixel 102. In some embodiments, the pitches between any two directly adjacent first sub-pixels 101 and second sub-pixels 102 are substantially equal. However, the present disclosure is not limited thereto, and other alternative embodiments are possible.

Figure 5:
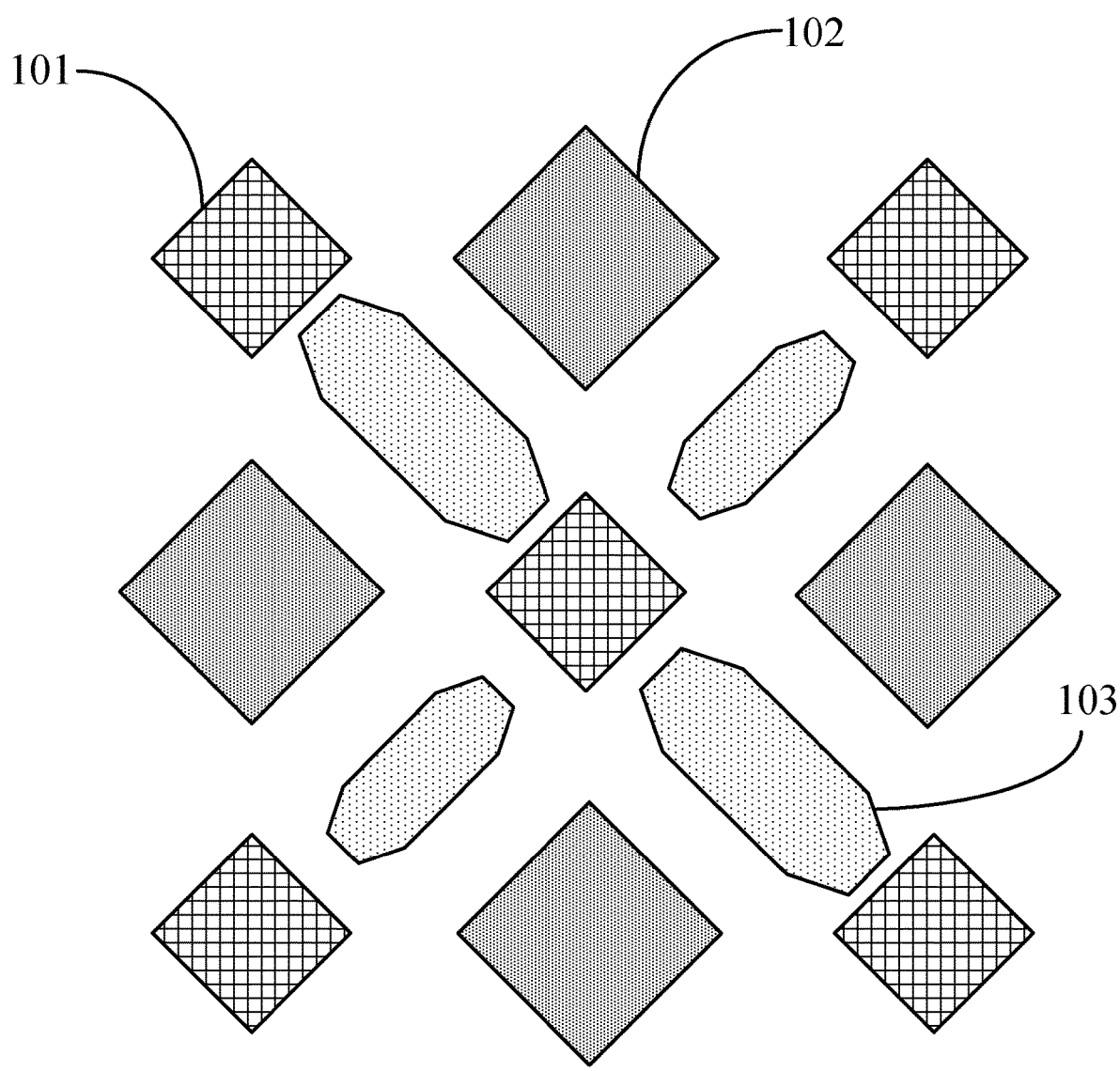
FIG. 5 is a schematic plan view of a partial area of another variation of the pixel arrangement of FIG. 1.

FIG. 5 is a schematic plan view of a partial area of another variation of the pixel arrangement 100 of FIG. 1.

A variation in the shape and area of the third sub-pixel 103 is shown in FIG. 5. Specifically, the third sub-pixels 103A, 103B, 103C, and 103D have substantially the same shape of a convex polygon, and the third sub-pixels 103A and 103C have an area larger than the area of the third sub-pixels 103B and 103D. This provides a flexible design of the pixel pattern.

Figure 6:
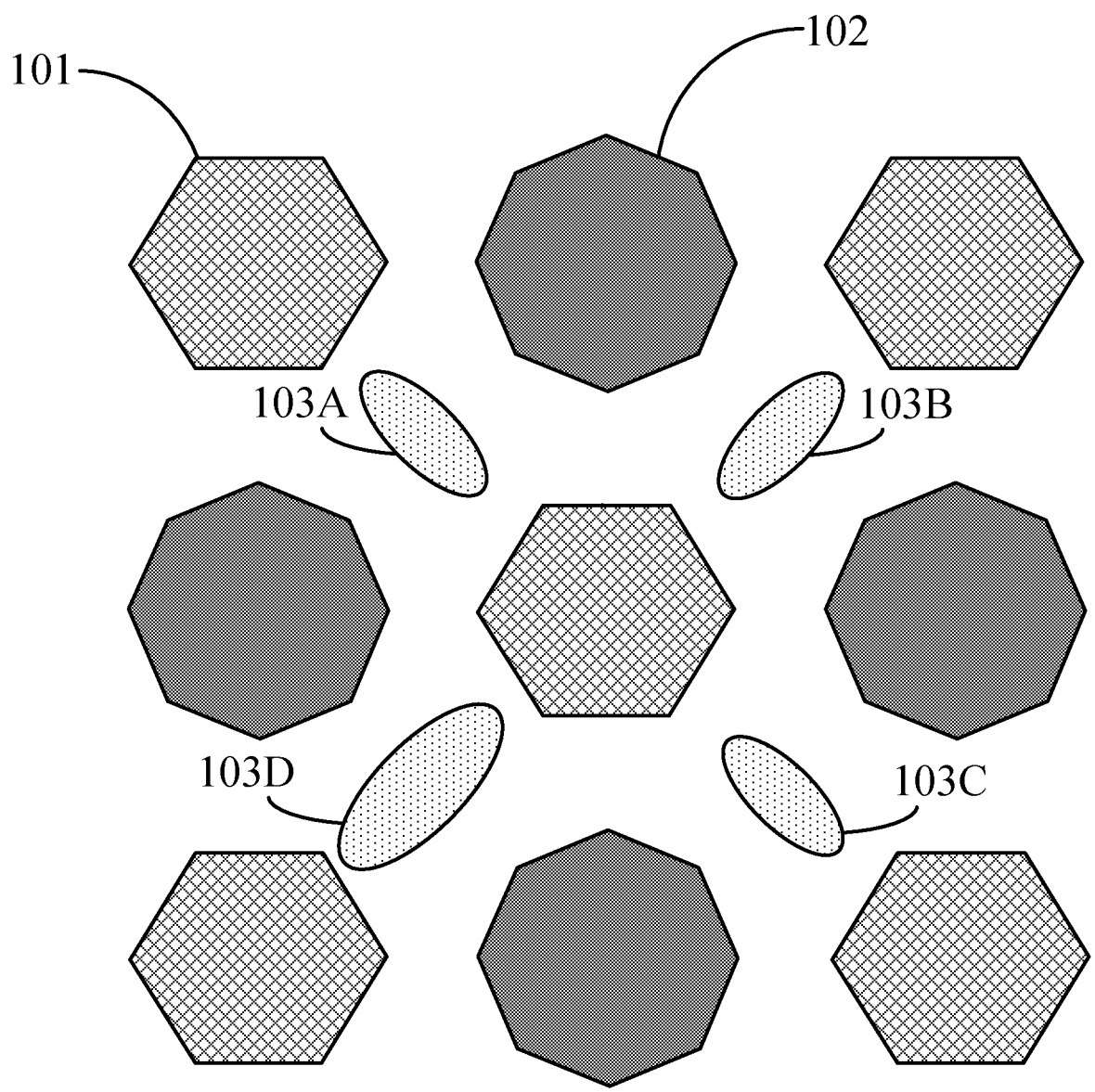
FIG. 6 is a schematic plan view of a partial area of another variation of the pixel arrangement of FIG. 1.

FIG. 6 is a schematic plan view of a partial area of another variation of the pixel arrangement 100 of FIG. 1.

A variation in the shape of the first sub-pixel 101, a variation in the shape of the second sub-pixel 102, and a variation in the shape and area of the third sub-pixel 103 are shown in FIG. 6. In this example, the first sub-pixels 101 have substantially the same regular hexagonal shape, the second sub-pixels 102 have substantially the same regular octagonal shape, and the third sub-pixels 103A, 103B, 103C, and 103D have substantially the same elliptical shape, with the third sub-pixel 103D having an area larger than the area of any of the third sub-pixels 103A, 103B, and 103C. This configuration provides a flexible design of the pixel pattern.

In an alternative embodiment, the third sub-pixels 103A, 103B, 103C, and 103D may each have a different ratio of major axis to minor axis. That is, the third sub-pixels 103A, 103B, 103C, and 103D may have different specific shapes, although they are all elliptical.

Figure 7:
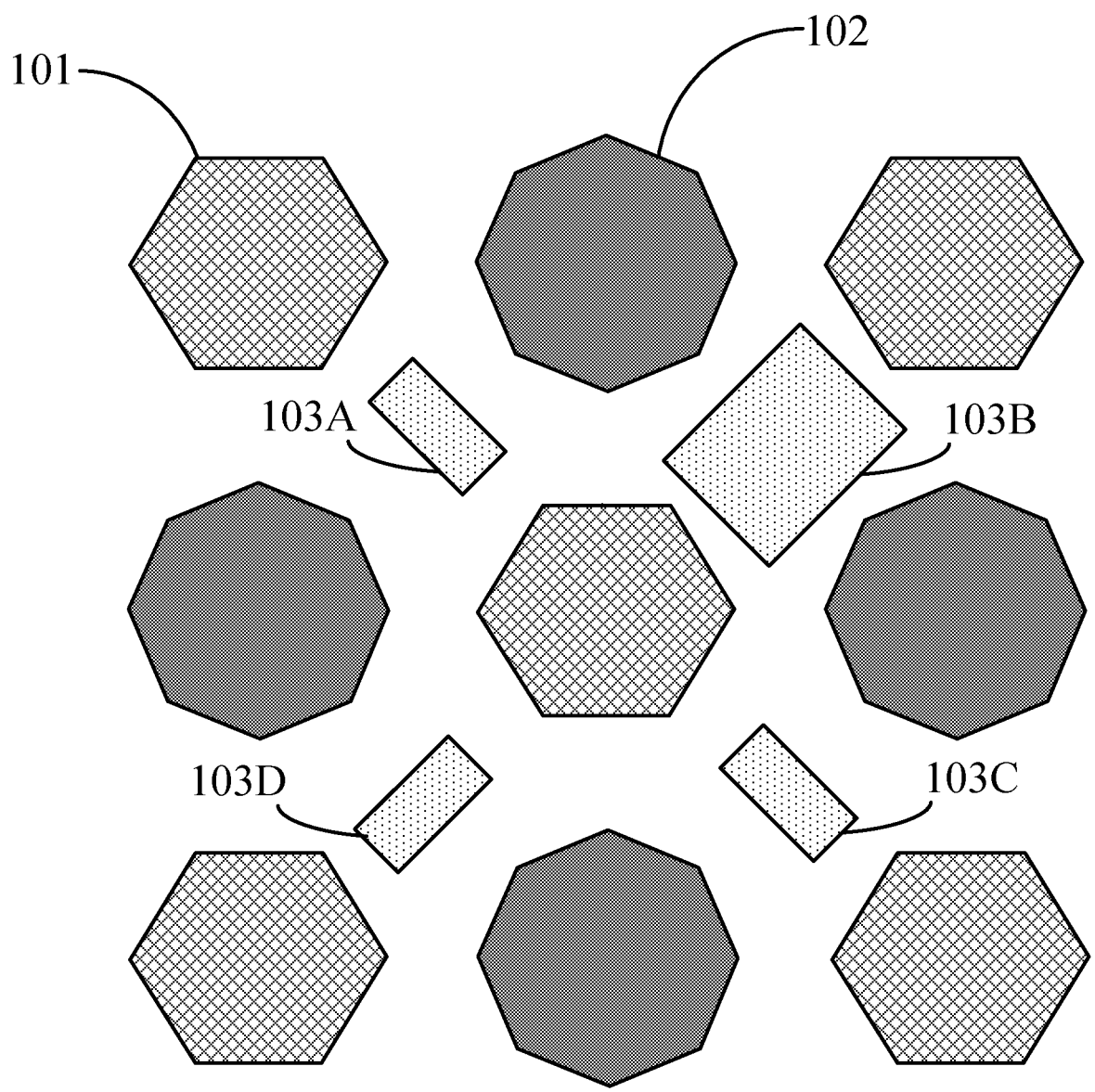
FIG. 7 is a schematic plan view of a partial area of another variation of the pixel arrangement of FIG. 1.

FIG. 7 is a schematic plan view of a partial area of another variation of the pixel arrangement of FIG. 1.

A variation in the shape of the first sub-pixel 101, a variation in the shape of the second sub-pixel 102, and a variation in the shape and area of the third sub-pixel 103 are shown in FIG. 7. In this example, the first sub-pixels 101 have substantially the same regular hexagonal shape, the second sub-pixels 102 have substantially the same regular octagonal shape, and the third sub-pixels 103A, 103B, 103C, and 103D each have a rectangular shape, with the third sub-pixel 103B having an area larger than the area of any one of the third sub-pixels 103A, 103C, and 103D. This configuration provides a flexible design of the pixel pattern.

In alternative embodiments, the third sub-pixels 103A, 103B, 103C, and 103D may each have a different aspect ratio. That is, the third sub-pixels 103A, 103B, 103C, and 103D may have different specific shapes, although they are all rectangular.

Figure 8:
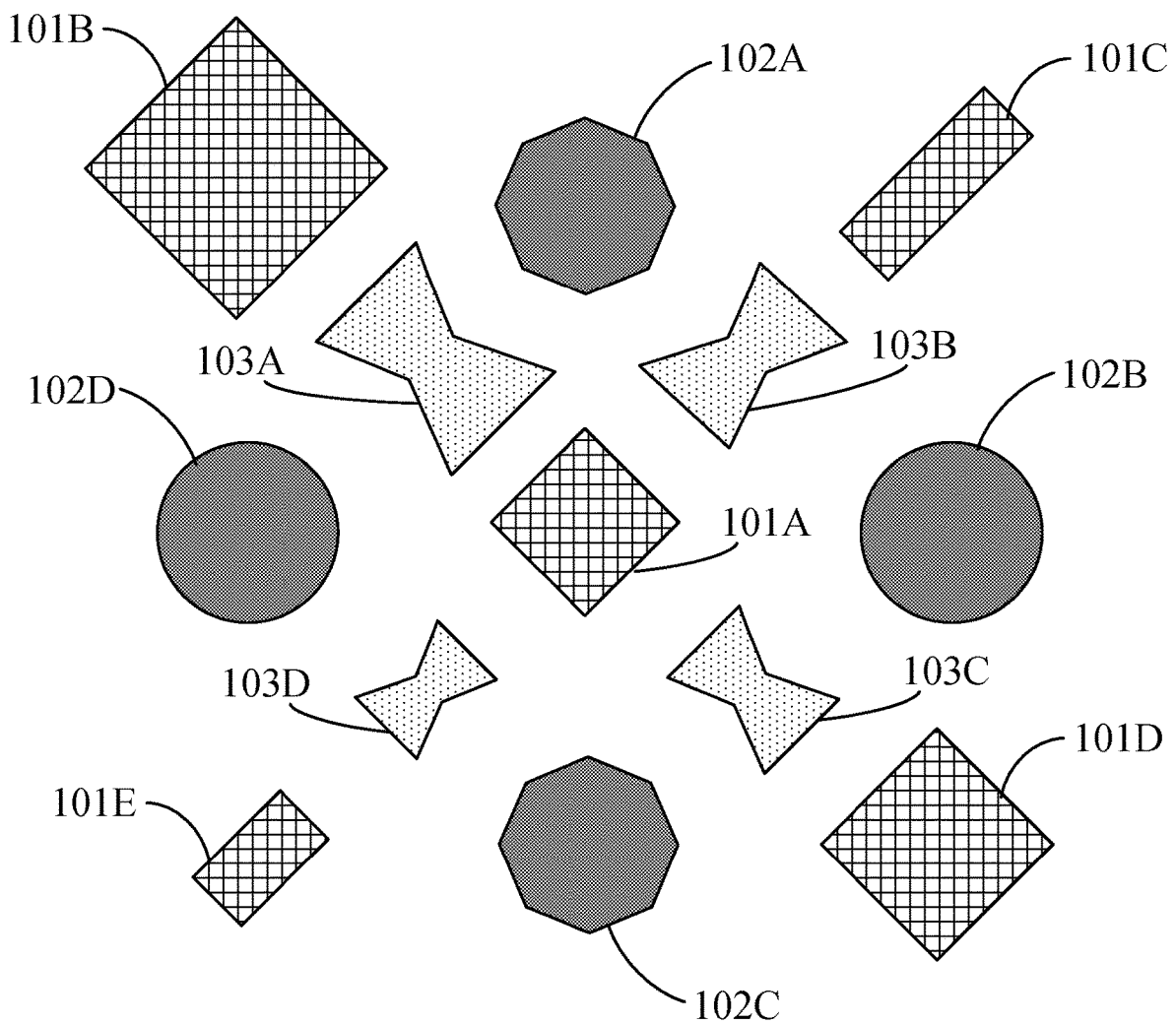
FIG. 8 is a schematic plan view of a partial area of another variation of the pixel arrangement of FIG. 1.

FIG. 8 is a schematic plan view of a partial area of another variation of the pixel arrangement of FIG. 1, in which variations in the shape and area of the first sub-pixel 101, the second sub-pixel 102, and the third sub-pixel 103 are shown.

In this embodiment, first ones of the first sub-pixels 101 each have an area and second ones of the first sub-pixels 101 each have another area different from that area, and first ones of the first sub-pixels 101 each have a shape and second ones of the first sub-pixels 101 has another shape different from that shape. As shown in FIG. 8, the first sub-pixels 101A, 101B, 101C, 101D, and 101E each have a different area, wherein the first sub-pixels 101A, 101B, and 101D each have a square shape, and the first sub-pixels 101C and 101E each have a shape of a non-square rectangle.

In this embodiment, first ones of the second sub-pixels 102 each have an area and second ones of the second sub-pixels 102 each have another area different from that area, and first ones of the second sub-pixels 102 each have a shape and second ones of the second sub-pixels 102 each have another shape different from that shape. As shown in FIG. 8, the second sub-pixels 102B and 102D are circular and have an area larger than the area of the second sub-pixels 102A and 102C which are regular octagons.

In this embodiment, the third sub-pixels 103A, 103B, 103C, and 103D have substantially the same concave polygon shape but different areas, with the third sub-pixel 103A being the largest and the third sub-pixel 103D the smallest.

Although various variations of the first sub-pixel 101, the second sub-pixel 102, and the third sub-pixel 103 are described above in connection with FIGS. 1-8, the present disclosure is not limited thereto. For example, the first sub-pixel 101, the second sub-pixel 102, and the third sub-pixel 103 may have a shape selected from a group consisting of a rectangle, an ellipse, a convex polygon, a concave polygon, a triangle, and a circle. Other irregular shapes are also possible. In practice, the shape, orientation, and relative position of the first sub-pixel 101, the second sub-pixel 102, and the third sub-pixel 103 can be designed as needed.

In the embodiments described above, the third sub-pixel 103 may be a green sub-pixel. In some embodiments, the first sub-pixel 101 may be a red sub-pixel and the second sub-pixel 102 may be a blue sub-pixel. Alternatively, the first sub-pixel 101 may be a blue sub-pixel, and the second sub-pixel 102 may be a red sub-pixel. Since the human eye is more sensitive to green light, the area of the third sub-pixel 103 can be relatively small. In some embodiments, the area of the green sub-pixel is smaller than the area of the red sub-pixel, and the area of the red sub-pixel is smaller than the area of the blue sub-pixel. Alternatively, the area of the red sub-pixel is smaller than the area of the green sub-pixel, and the area of the green sub-pixel is smaller than the area of the blue sub-pixel. The red sub-pixels have a first total area, the green sub-pixels have a second total area, and the blue sub-pixels have a third total area. In some embodiments, the first total area, the second total area, and the third total area have a ratio of 1:(1.1 to 1.5):(1.2 to 1.7), further 1:(1.2 to 1.35):(1.4 to 1.55), or further, 1:1.27:1.46. This provides different levels of visual quality improvement compared to pixel patterns in which the red, green, and blue sub-pixels have the same total area. In some embodiments, the red sub-pixels, the green sub-pixels, and the blue sub-pixels have a ratio of approximately 1:2:1 in quantity. This can be achieved by sufficiently extending the pattern of the pixel arrangement in the first direction D1 and the second direction D2. The term "approximately" is intended to cover a certain range of error, such as ±10% (of the number of the red or blue sub-pixels). For example, 1:1.9:1 can be considered to be "approximately 1:2:1".

Figure 9:
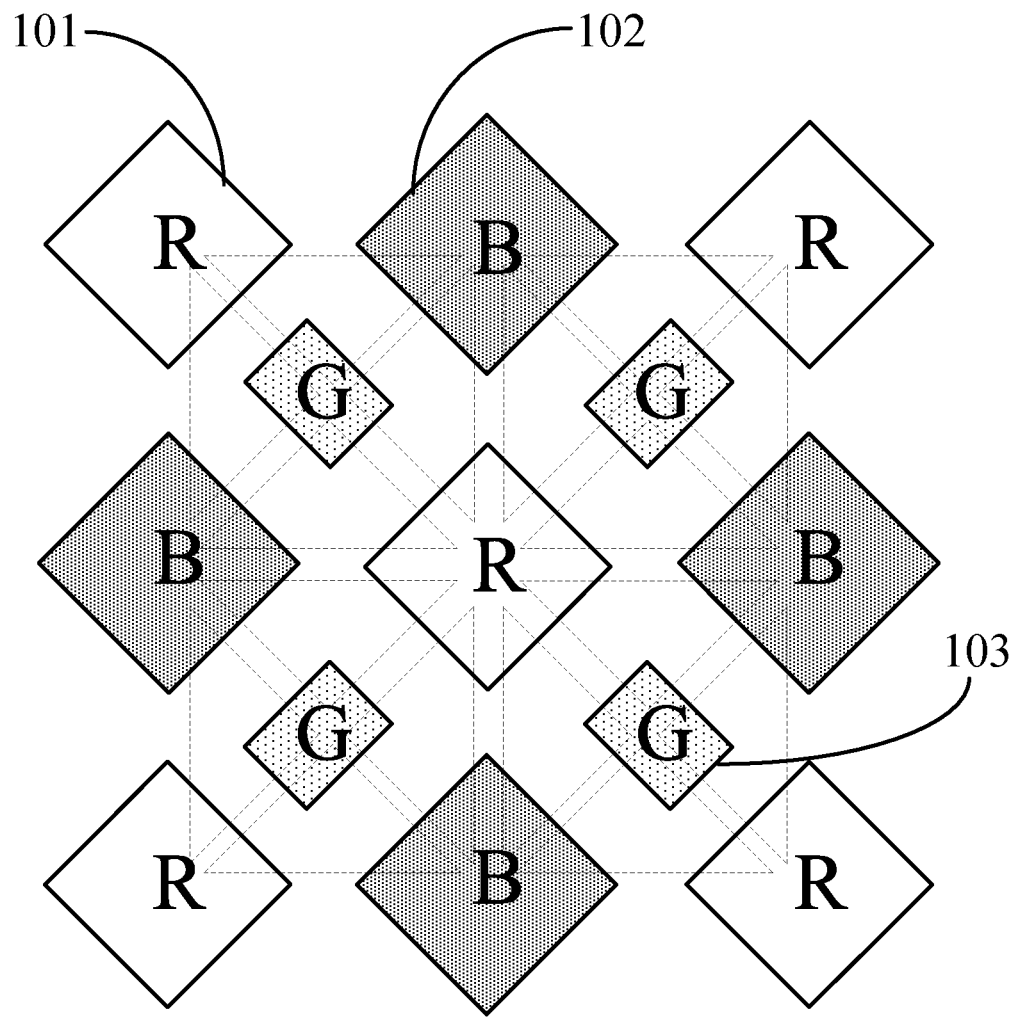
FIG. 9 is a schematic view generally showing a principle of color-borrowing of a pixel arrangement according to an embodiment of the present disclosure.

FIG. 9 generally illustrates the principle of color-borrowing of a pixel arrangement in accordance with an embodiment of the present disclosure.

In this example, the first sub-pixels 101 are red sub-pixels, the second sub-pixels 102 are blue sub-pixels, and the third sub-pixels 103 are green sub-pixels. As shown in FIG. 9, the green sub-pixel G, the red sub-pixel R, and the blue sub-pixel B located at the vertices of each of the broken-line triangles form a virtual pixel. Advantageously, directly adjacent broken-line triangles always share a common sub-pixel. This provides a higher virtual resolution than the physical resolution, which improves the display effect. Furthermore, as described above, the first sub-pixels 101, the second sub-pixels 102, and the third sub-pixels 103 are allowed to be arranged more closely, thereby providing a larger area per sub-pixel than the existing pixel arrangements.

Figure 10:
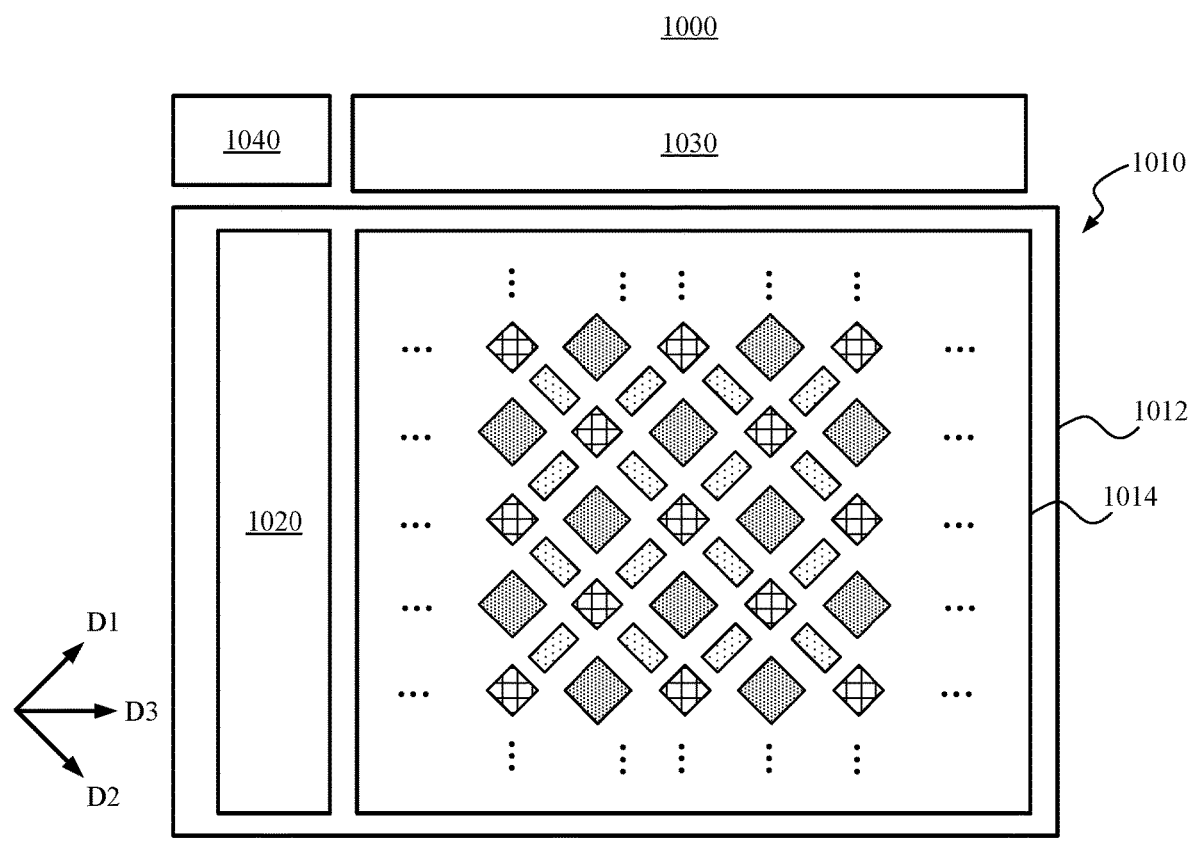
FIG. 10 is a schematic plan view of a display device according to an embodiment of the present disclosure.

FIG. 10 is a schematic plan view of a display device 1000 in accordance with an embodiment of the present disclosure.

Referring to FIG. 10, the display device 1000 includes a display panel 1010, a scan driver 1020, a data driver 1030, and a timing controller 1040.

The display panel 1010 includes a display substrate 1012 and a pixel arrangement 1014 formed on the display substrate 1012. The pixel arrangement 1014 may take the form of any of the pixel arrangement 100 and its variations described above with respect to FIGS. 1 to 9. The pixel arrangement 1014 is arranged such that each of the first direction D1 and the second direction D2 (according to which the configurations of the pixel arrangement 100 and its various modifications have been described) intersects a length direction D3 of the display substrate 1012 at approximately 45 degrees. The term "approximately" is intended to cover a certain range of error, such as ±10%. For example, 40.5 degrees is considered to be "approximately 45 degrees." The sub-pixels in the pixel arrangement 1014 may be organic electroluminescence sub-pixels, although the disclosure is not limited thereto.

From the perspective of the first virtual matrix, the pixel arrangement 1014 includes a plurality of adjoining first virtual matrices. In the row direction (the horizontal direction in FIG. 10), every two directly adjacent ones of the first virtual rectangles have a common side such that the sub-pixels on the common side are shared by the two directly adjacent first virtual rectangles. In the column direction (the vertical direction in FIG. 10), every two directly adjacent ones of the first virtual rectangles have a common side such that the sub-pixels on the common side are shared by the two directly adjacent first virtual rectangles.

The scan driver 1020 outputs gate scan signals to the display panel 1010. In some exemplary embodiments, the scan driver 1020 may be directly integrated in the display substrate 1012 as a gate driver on array (GOA) circuit. Alternatively, the scan driver 1020 may be connected to the display panel 1010 by a Tape Carrier Package (TCP). The implementation of the scan driver 1020 may be known, a detailed description of which is thus omitted.

The data driver 1030 outputs data voltages to the display panel 1010. In some embodiments, the data driver 1030 may include a plurality of data driver chips which operate in parallel. The implementation of the data driver 1030 may be known, a detailed description of which is thus omitted.

The timing controller 1040 controls the operations of the scan driver 1020 and the data driver 1030. Specifically, the timing controller 1040 outputs data control signals and image data to control the driving operation of the data driver 1030, and outputs gate control signals to control the driving operation of the scan driver 1020. The data control signals and image data are applied to the data driver 1030. The gate control signals are applied to the scan driver 1020. The implementation of the timing controller 1040 may be known, and a detailed description of which is thus omitted.

The display device 1000 has the same advantages as those of the pixel arrangement embodiments described above with respect to FIGS. 1 to 9, which will not be repeated herein. By way of example and not limitation, the display device 1000 can be any product or component having a display function, such as a cell phone, a tablet, a television, a display, a notebook computer, a digital photo frame, a navigator, and the like.

Figure 11A:
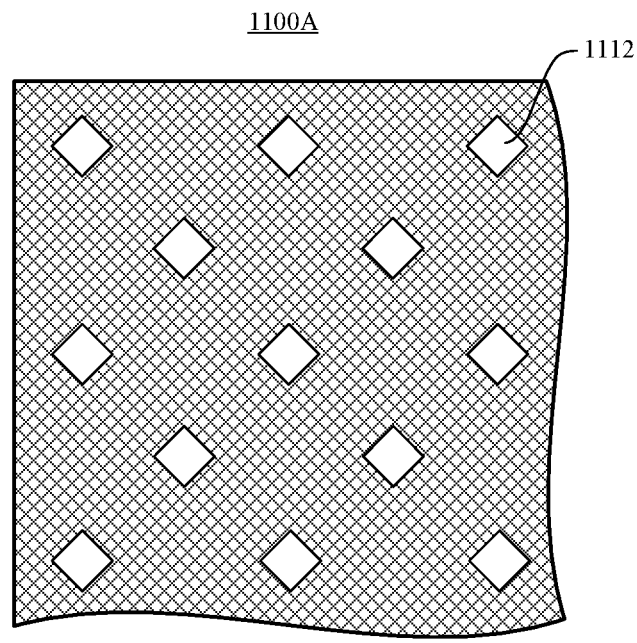
FIGS. 11A, 11B, and 11C are schematic plan views of a set of masks according to an embodiment of the present disclosure.
Figure 11B:
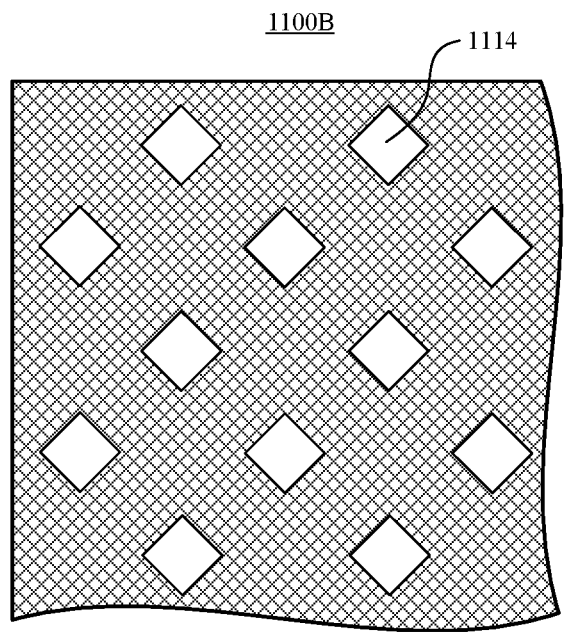
Figure 11C:
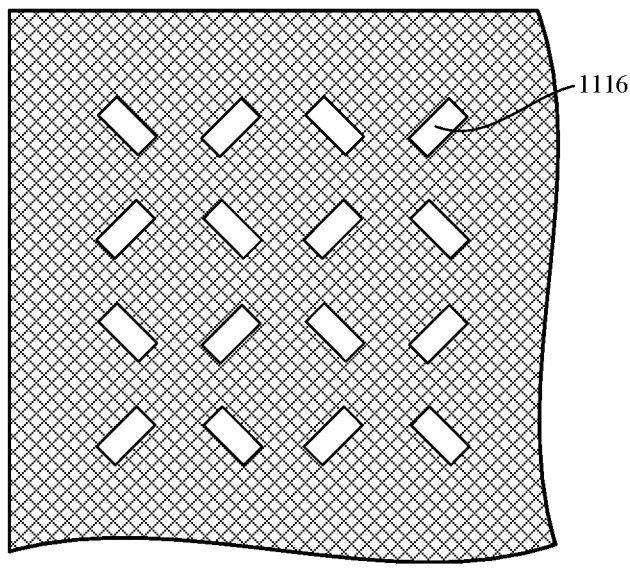

FIGS. 11A, 11B, and 11C are schematic plan views of a set of masks in accordance with an embodiment of the present disclosure. The group of masks includes a first mask 1100A, a second mask 1100B, and a third mask 1100C.

Referring to FIG. 11A, only a portion of the first mask 1100A is shown. The first mask 1100A defines a plurality of first openings 1112. The plurality of first openings 1112 are arranged to have a pattern corresponding to the pattern of the first sub-pixels of any one of the pixel arrangement 100 or its variations described above with respect to FIGS. 1 to 9. In this example, the plurality of first openings 1112 are arranged to have a pattern corresponding to the pattern of the first sub-pixels of the pixel arrangement 100 of FIG. 1. In some embodiments, the mask 1100A is a fine metal mask that can be used in an evaporation process to form a desired pixel pattern.

Referring to FIG. 11B, only a portion of the second mask 1100B is shown. The second mask 1100B defines a plurality of second openings 1114. The plurality of second openings 1114 are arranged to have a pattern corresponding to the pattern of the second sub-pixels of any one of the pixel arrangement 100 or its variations described above with respect to FIGS. 1 to 9. In this example, the plurality of second openings 1114 are arranged to have a pattern corresponding to the pattern of the second sub-pixels of the pixel arrangement 100 of FIG. 1. In some embodiments, the mask 1100B is a fine metal mask that can be used in an evaporation process to form a desired pixel pattern.

Referring to FIG. 11C, only a portion of the third mask 1100C is shown. The third mask 1100C defines a plurality of third openings 1116. The plurality of third openings 1116 are arranged to have a pattern corresponding to the pattern of the third sub-pixels of any one of the pixel arrangement 100 or its variations described above with respect to FIGS. 1 to 9. In this example, the plurality of third openings 1116 are arranged to have a pattern corresponding to the pattern of the third sub-pixels of the pixel arrangement 100 of FIG. 1. In some embodiments, the mask 1100C is a fine metal mask that can be used in an evaporation process to form a desired pixel pattern.

The masks 1100A, 1100B, and 1100C may provide the same advantages as those of the pixel arrangement embodiments described above with respect to FIGS. 1 to 9, which are not repeated herein.

Figure 12:
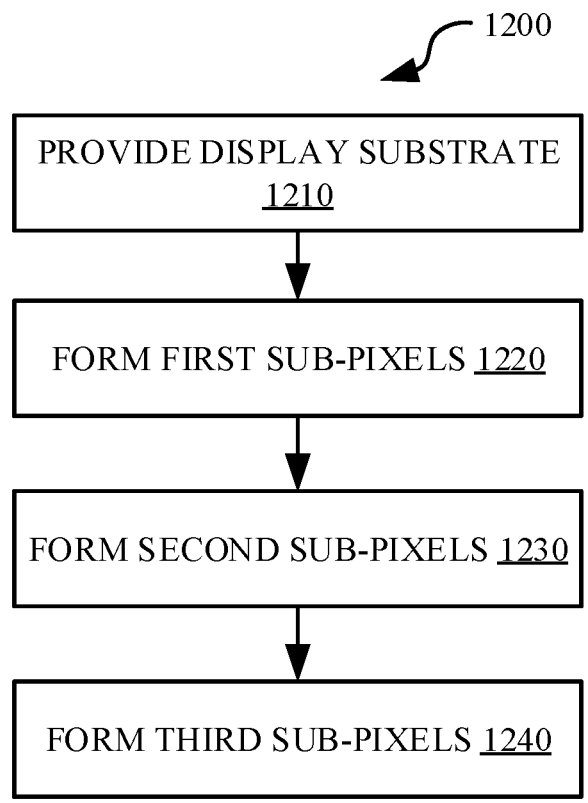
FIG. 12 is a flow chart of a method of manufacturing a pixel arrangement in accordance with an embodiment of the present disclosure.

FIG. 12 is a flow diagram of a method 1200 of manufacturing a pixel arrangement in accordance with an embodiment of the present disclosure. Embodiments of the pixel arrangement described above with respect to FIGS. 1 to 9 can be implemented using the method 1200 and the masks 1100A, 1100B, and 1100C.

Referring to FIG. 12, at step 1210, a display substrate is provided. The display substrate is typically a back plate that has been provided with driving circuits formed of, for example, thin film transistors (TFTs). At step 1220, a first electroluminescent material is evaporated and passes through the plurality of first openings 1112 of the first mask 1100A, with the evaporated first electroluminescent material deposited onto the display substrate to form the first sub-pixels 101. At step 1230, a second electroluminescent material is evaporated and passes through the plurality of second openings 1114 of the second mask 1100B, with the evaporated second electroluminescent material deposited onto the display substrate to form the second sub-pixels 102. At step 1240, the third electroluminescent material is evaporated and passes through the plurality of third openings 1116 of the third mask 1100C, with the evaporated third electroluminescent material deposited onto the display substrate to form the third sub-pixels 103. Steps 1220 to 1240 are generally referred to as evaporation, by which the pixel pattern will be formed at predetermined positions on the display substrate. It will be understood that steps 1220 to 1240 can be performed in an order different from that illustrated and described. In some embodiments, the electroluminescent materials may be organic electroluminescent materials. Other electroluminescent materials are possible.

Variations to the disclosed embodiments can be understood and effected by those skilled in the art from a study of the drawings, the disclosure, and the appended claims. Although the various operations are depicted in the drawings in a particular order, this should not be construed as requiring that the operations be performed in the particular order shown or in a sequential order, nor should it be construed as requiring all of the operations shown to be performed to achieve the desired result. In the claims, the word "comprising" does not exclude other elements or steps, and the indefinite article "a" or "an" does not exclude a plurality. The mere fact that certain measures are recited in mutually different dependent claims does not indicate that the measures cannot be used to advantage.

What is claimed is:

1. A pixel arrangement comprising:
   five first sub-pixels located respectively at a central position and four vertex positions of a first virtual rectangle;
   four second sub-pixels located at respective central positions of four sides of the first virtual rectangle; and
   four third sub-pixels located in respective four second virtual rectangles,
   wherein each of the second virtual rectangles being defined by a corresponding vertex position of the four vertex positions of the first virtual rectangle, respective center positions of two adjacent sides of the four sides of the first virtual rectangle that include the corresponding vertex position, and a center position of the first virtual rectangle, the four second virtual rectangles forming the first virtual rectangle, and
   wherein the five first sub-pixels have different areas from each other, and the four third sub-pixels have different areas from each other.

2. The pixel arrangement of claim 1, wherein, among the four second sub-pixels, an area of at least one second sub-pixel is different from that of other second sub-pixel.

3. The pixel arrangement of claim 1, wherein the four third sub-pixels have a same type of shape.

4. The pixel arrangement of claim 3, wherein the four third sub-pixels have a shape different from that of the five first sub-pixels and different from that of the four second sub-pixels.

5. The pixel arrangement of claim 1, wherein, among the four second sub-pixels, a shape of at least one second sub-pixel is different from that of other second sub-pixel.

6. The pixel arrangement of claim 1, wherein, among the five first sub-pixels, a shape of at least one first sub-pixel is different from that of other first sub-pixel.

7. The pixel arrangement of claim 1, wherein the first sub-pixels are red sub-pixels, the second sub-pixels are blue sub-pixels, and the third sub-pixels are green sub-pixels.

8. The pixel arrangement of claim 1, wherein the first sub-pixels are blue sub-pixels, the second sub-pixels are red sub-pixels, and the third sub-pixels are green sub-pixels.

9. A display panel comprising:
a display substrate; and
a plurality of adjoining pixel arrangements of claim 1, the pixel arrangements being formed on the display substrate,
wherein in a row direction every two directly adjacent ones of first virtual rectangles have a common side such that sub-pixels on the common side are shared by two directly adjacent first virtual rectangles, and
wherein in a column direction every two directly adjacent ones of the first virtual rectangles has a common side such that sub-pixels on the common side are shared by two directly adjacent first virtual rectangles.

10. The display panel of claim 9, wherein the first sub-pixels are red sub-pixels, the second sub-pixels are blue sub-pixels, and the third sub-pixels are green sub-pixels.

11. The display panel of claim 10, wherein the red sub-pixels have a first total area, the green sub-pixels have a second total area, and the blue sub-pixels have a third total area, and wherein the first total area, the second total area, and the third total area have a ratio of 1:(1.1 to 1.5):(1.2 to 1.7), further 1:(1.2 to 1.35):(1.4 to 1.55), or further 1:1.27:1.46.

* * * * *